United States Patent
Ishiyama et al.

(10) Patent No.: US 7,537,846 B2
(45) Date of Patent: May 26, 2009

(54) MAGNETIC DISK, METHOD OF MANUFACTURING THE MAGNETIC DISK AND METHOD OF EVALUATING THE MAGNETIC DISK

(75) Inventors: Masafumi Ishiyama, Singapore (SG); Kenji Ayama, Singapore (SG)

(73) Assignees: Hoya Corporation, Tokyo (JP); Hoya Magnetics Singapore Pte. Ltd., Singapore (SG)

( * ) Notice: Subject to any disclaimer, the term of this patent is extended or adjusted under 35 U.S.C. 154(b) by 418 days.

(21) Appl. No.: 10/984,766

(22) Filed: Nov. 10, 2004

(65) Prior Publication Data
US 2005/0181240 A1    Aug. 18, 2005

(30) Foreign Application Priority Data
Nov. 11, 2003    (JP) ............................. 2003-381823

(51) Int. Cl.
G11B 5/65    (2006.01)
C23C 14/00    (2006.01)

(52) U.S. Cl. .............. 428/833.3; 428/833.2; 428/835.1; 204/192.11

(58) Field of Classification Search .............. 428/833.1, 428/833.2, 833.3, 833.4, 833.5, 833.6, 835, 428/835.1, 835.2, 835.3, 835.4, 835.7, 835.8, 428/35.4, 900; 427/130, 131; 204/192.11
See application file for complete search history.

(56) References Cited

U.S. PATENT DOCUMENTS

| | | | | |
|---|---|---|---|---|
| 5,614,314 A | * | 3/1997 | Itoh et al. ................. | 428/835.1 |
| 5,616,179 A | * | 4/1997 | Baldwin et al. ........ | 204/192.11 |
| 5,837,357 A | * | 11/1998 | Matsuo et al. ........... | 428/833.6 |
| 5,858,477 A | * | 1/1999 | Veerasamy et al. .......... | 428/900 |
| 6,589,641 B1 | * | 7/2003 | Stirniman et al. ........ | 428/833.3 |
| 6,740,407 B1 | * | 5/2004 | Usuki et al. ................ | 428/35.4 |

FOREIGN PATENT DOCUMENTS

| | | | |
|---|---|---|---|
| JP | 6-195691 A | | 7/1994 |
| JP | 6-267063 A | | 9/1994 |
| JP | 7-192254 A | | 7/1995 |
| JP | 100091935 | | 4/1998 |
| JP | 10269546 | | 10/1998 |
| JP | 2001014657 | | 1/2001 |
| JP | 20011195723 | | 7/2001 |
| JP | 2001331931 | * | 11/2001 |

OTHER PUBLICATIONS

Translation JP 10-0091935.*
Translation JP 2001-0331931.*
Translation JP 2001-1195723.*
Translation JP 10-0269546.*
Translation Jp 2001-0014657.*

* cited by examiner

Primary Examiner—Kevin M Bernatz
Assistant Examiner—Louis Falasco
(74) Attorney, Agent, or Firm—Sughrue Mion, PLLC

(57) ABSTRACT

A protection layer containing carbon as a major component is deposited by plasma CVD. The protection layer has film quality such that, when a spectrum is obtained by excluding photoluminescence from a Raman spectrum in a wavenumber band from 900 cm$^{-1}$ to 1800 cm$^{-1}$ obtained by exciting the protection layer with an argon ion laser beam having a wavelength of 514.5 nm and the spectrum is subjected to waveform separation by the Gaussian function to split a D peak appearing around 1350 cm$^{-1}$ and a G peak appearing around 1520 cm$^{-1}$, the ratio Dw/Gw between a half width Dw of the D peak and a half width Gw of the G peak exceeds 0 and is not greater than 2.7.

1 Claim, 5 Drawing Sheets

MAGNETIC DISK, METHOD OF MANUFACTURING THE MAGNETIC DISK AND METHOD OF EVALUATING THE MAGNETIC DISK

This application claims priority to prior Japanese patent application JP2003-381823, the disclosure of which is incorporated herein by reference.

BACKGROUND OF THE INVENTION

This invention relates to a magnetic disk used for a magnetic disk apparatus such as HDD (hard disk drive) and, in particular, to a method of manufacturing the magnetic disk as well as a method of evaluating the magnetic disk.

Recently, in an information recording technique, in particular, in a magnetic recording technique, a drastic technical innovation is required following development of an IT industry. In a magnetic disk loaded in a magnetic disk apparatus such as a HDD (hard disk drive), an information recording density has been rapidly increased unlike in other magnetic recording media such as a magnetic tape and a flexible disk.

The magnetic disk comprises a nonmagnetic substrate and a magnetic layer formed thereon for recording information. On the magnetic layer, a protection layer is provided so as to protect the magnetic layer. On the protection layer, a lubricant layer is disposed so as to relieve interference from a magnetic head for carrying out recording and reproducing operations while flying over the magnetic disk. Such a magnetic disk is, for example, disclosed in Japanese Unexamined Patent Application Publication (JP-A) No. 6-195691 (see FIG. 6, hereinafter referred to as a patent document 1) and is known in the art.

As the protection layer of the magnetic disk, use is typically made of a hydrogenated carbon film which is deposited by sputtering a carbon target in an atmosphere of a mixed gas of an Ar (argon) gas and a hydrogen gas or a mixed gas of an Ar gas and a hydrocarbon gas (for example, methane gas).

In the hydrogenated carbon film, by adjusting a depositing method and a depositing condition, it is possible to relatively freely adjust mechanical characteristics such as a CSS (Contact Start Stop) durability. Therefore, the hydrogenated carbon film is widely used as the protection layer of the magnetic disk.

In order to obtain the protection layer having desired mechanical characteristics, it is conceivable to prepare a plurality of samples of magnetic disks by depositing sample protection layers in various manufacturing conditions, to evaluate the mechanical characteristics such as the CSS durability for these samples of magnetic disks, and to determine the manufacturing condition of the magnetic disk to be manufactured.

However, determination of the manufacturing condition using the above-mentioned method requires much time and labor and is troublesome. It is therefore impossible to quickly determine the manufacturing condition and the manufacturing cost is inevitably increased.

In view of the above, it has heretofore been attempted to find film quality parameters associated with the mechanical characteristics of the protection layer and to measure the film quality parameters by simple means, thereby maintaining the mechanical characteristic of the protection layer in the magnetic disk to be manufactured.

For example, the aforementioned patent document 1 discloses a method of evaluating the film quality of the protection layer by utilizing a peak intensity of a SP3 peak (D peak) and a peak intensity of a SP2 peak (G peak) in a Raman spectrum of the protection layer. Specifically, according to this technique, a ratio (B/A) of peak intensities is used as an evaluation basis where A represents a substantial peak intensity excluding photoluminescence at a wavenumber of the SP3 peak (D peak) and B represents a total peak intensity including the photoluminescence at the SP3 peak. Further, according to this technique, a ratio (D/G) of peak intensities is used as an evaluation basis where D represents a substantial peak intensity excluding photoluminescence at the wavenumber of the SP3 peak (D peak) and G represents a substantial peak intensity excluding photoluminescence at the wavenumber of the SP2 peak (G peak).

Moreover, Japanese Unexamined Patent Application Publication (JP-A) No. 6-267063 (see FIG. 1, hereinafter referred to as a patent document 2) and Japanese Unexamined Patent Application Publication (JP-A) No. 7-192254 (see FIG. 1, hereinafter referred to as a patent document 3) disclose a method of evaluating the film quality of the protection layer by using, as an evaluation basis, an area ratio (B/A) at half widths of waveforms of a SP3 peak (D peak) and a SP2 peak (G peak) in the Raman spectrum of the protection layer.

SUMMARY OF THE INVENTION

In the above-described magnetic disk, an increase of an information recording capacity has been recently required. For example, in order to achieve an information recording density of 40 Gbit/inch$^2$ or higher, various approaches have been made. For the purpose of achieving such an information recording density, it is necessary to improve a spacing loss between a magnetic disk and a magnetic head to thereby improve a S/N ratio (Signal Noise Ratio) of a recording signal.

In order to improve the spacing loss between the magnetic disk and the magnetic head to such a degree that the above-mentioned information recording density is achieved, it is required to reduce a space (magnetic spacing) between a magnetic layer of the magnetic disk and a recording/reproducing element of the magnetic head to 20 nm or less. Recently, it is further required to reduce the magnetic spacing to 10 nm or less.

In case where the space between the magnetic layer of the magnetic disk and the recording/reproducing element of the magnetic head is reduced to 20 nm or less, the film thickness of the protection layer of the magnetic disk must be decreased to 5 nm or less.

For the purpose of increasing the information recording capacity of the magnetic disk, it is necessary to reduce an area of a useless region where information signals are not recorded on the magnetic disk. In view of the above, as a start/stop system of the HDD (hard disk drive), an LUL system ("Load Unload system", may be referred to as "Ramp Load system") capable of increasing the information recording capacity is being introduced instead of a CSS system (Contact Start Stop system) which has conventionally been used.

FIG. 4 is a plan view showing a positional relationship between the magnetic disk and the magnetic head in the CSS system.

FIG. 5 is a plan view showing a positional relationship between the magnetic disk and the magnetic head in the LUL system.

In the CSS system, as illustrated in FIG. 4, it is necessary to form, on a magnetic disk 101, a CSS zone 103 on which a magnetic head 102 is placed in an unused state (stopped state) of the magnetic disk 101. Information signals can not be recorded in the CSS zone 103. Therefore, a region where the information signals are recorded in the magnetic disk is reduced in area.

In contrast, in the LUL system, in the unused state (stopped state) of the magnetic disk 101, the magnetic head 102 is moved towards an outer periphery of the magnetic disk 101 and is retreated from a range above the magnetic disk 101 to be supported by a notch 104, as illustrate in FIG. 5. Accordingly, it is unnecessary to form a region, such as the CSS zone 103, in which the information signals can not be recorded. Therefore, the area of the region where the information signals are recorded in the magnetic disk 101 can be maximized.

In accordance with such trend, as the magnetic disk, the magnetic disk for the LUL system is required instead of the magnetic disk for the CSS system. In the magnetic disk for the LUL system, the protection layer is required to be superior in LUL durability.

FIG. 6 is a side view for explaining durability of the protection layer in the CSS system.

FIG. 7 is a side view for explaining durability of the protection layer in the LUL system.

The durability of the protection layer in the CSS system is the durability mainly against sliding movement of the magnetic head 102 as shown in FIG. 6 while the durability of the protection layer in the LUL system is the durability further capable of withstanding collision with the magnetic head 102 as shown in FIG. 7.

As mentioned above, in order to realize the increase of the information recording capacity in the magnetic disk, the film thickness of the protection layer must be 5 nm or less so as to improve the spacing loss between the magnetic disk and the magnetic head. Further, the LUL durability of the protection layer must be excellent so as to introduce the LUL system.

However, if the film thickness of the protection layer is reduced to 5 nm or less, the durability such as a wear resistance and a shock resistance and the mechanical characteristics are deteriorated so that a sufficient strength can not be assured. In particular, in the magnetic disk apparatus using the LUL system, fine scratches or the like may occur on the magnetic disk by an impact force caused when the magnetic head is loaded onto the magnetic disk. Upon occurrence of such scratches on the magnetic disk, reproduced signals are degraded in quality. In addition, a recording/reproducing element portion of the magnetic head is contaminated because of dust generated by damage of the protection layer. This may result in a significant defect that recording/reproducing operations become impossible.

As disclosed in the aforementioned patent document 1, the magnetic disk was produced by strictly controlling the peak intensity ratio (B/A or D/G) of the Raman spectrum of the protection layer. As a result, the protection layer having stable durability and mechanical characteristics could not always be obtained and the above-described defect could not be sufficiently suppressed.

Specifically, in case where a large number of magnetic disks were produced, even when the peak intensity ratios (B/A or D/G) of the protection layers were equal to one another, some of the magnetic disks had the protection layers sufficient in durability and mechanical characteristics while some other magnetic disks had the protection layers insufficient in durability and mechanical characteristics. If the variation in characteristics of the individual magnetic disks is large as mentioned above, it is impossible to stably produce a large number of magnetic disks.

Further, even if the methods disclosed in the aforementioned patent documents 2 and 3 were adopted for the purpose of maintaining the characteristics of the protection layer, the protection layers having the stable characteristics could not be obtained. Thus, even by the methods disclosed in the aforementioned patent documents 2 and 3, it is impossible to stably produce a large number of magnetic disks.

The techniques disclosed in the patent documents 1 through 3 assumes that the film thickness of the protection layer is 10 nm or more. In case where the protection layer having the film thickness of 10 nm or more is produced, these techniques seem to be effective as the methods of evaluating and maintaining the wear resistance or the CSS durability. However, it is found out that, in case where the protection layer having the film thickness of 5 nm or less is produced, the methods according to these conventional techniques can not be used because no relevancy was observed with the wear resistance or the LUL durability of the protection layer.

The present invention has been made under the above-mentioned circumstances. It is a first object of this invention to provide a magnetic disk which has a magnetic layer formed on a nonmagnetic substrate and a protection layer formed on the magnetic layer and which is superior in durability of the protection layer, in particular, in LUL durability, even if a film thickness of the protection layer is, for example, 5 nm or less.

It is a second object of this invention to provide a magnetic disk for an LUL system, which is to be loaded in a hard disk drive of the LUL system.

It is a third object of this invention to provide a magnetic disk stable in characteristics of a protection layer and suitable for mass-production.

It is a fourth object of this invention to provide a method of manufacturing a magnetic disk which is suitable for obtaining the magnetic disk having the above-mentioned superior durability and a method of evaluating the magnetic disk.

In view of the above-mentioned objects, the present inventors enthusiastically studied with respect to film quality of the protection layer having stable durability, in particular, superior LUL durability, even when the film thickness of the protection layer of the magnetic disk is reduced to, for example, 5 nm or less.

As a result, it is found out that the superior durability, in particular, the superior LUL durability is obtainable only when the protection layer containing carbon as a major component has film quality such that a Raman spectrum thereof has a predetermined spectrum shape.

The Raman spectrum having the predetermined shape which is found out by the present inventors is such that, when a spectrum is obtained by excluding photoluminescence from a Raman spectrum in a wavenumber band from 900 $cm^{-1}$ (Kayser) to 1800 $cm^{-1}$ (Kayser) obtained by excitation with an argon ion laser beam having a wavelength of 514.5 nm and the spectrum is subjected to waveform separation by the Gaussian function to split a peak (D peak) appearing on a low wavenumber side (around 1350 $cm^{-1}$ (Kayser)) and a peak (G peak) appearing on a high wavenumber side (around 1520 $cm^{-1}$ (Kayser)), the ratio [Dw/Gw] between a half width [Dw] of the D peak and a half width [Gw] of the G peak exceeds 0 and is not greater than 2.7.

It is found out that superior durability, in particular, superior LUL durability can be obtained in the protection layer containing carbon as a major component and having the above-mentioned Raman spectrum shape. The present inventors are first persons who proposed evaluation of the protection layer containing carbon as a major component based upon the above-mentioned ratio [Dw/Gw].

More preferably, in case where the ratio [Dw/Gw] between the half width [Dw] of the D peak and the half width [Gw] of the G peak falls within a range between 2 and 2.7, more excellent LUL durability can be obtained.

Further, the present inventors found out that the protection layer containing carbon as a major component and having such film quality can be obtained, for example, by performing deposition under predetermined conditions by the use of plasma CVD.

Specifically, the present invention has the following structures.

[Structure 1]

According to this invention, there is provide a magnetic disk having a magnetic layer formed on a nonmagnetic substrate and a protection layer formed on the magnetic layer, wherein the protection layer contains carbon as a major component and is deposited by plasma CVD, the protection layer having a characteristic such that, when a spectrum obtained by excluding photoluminescence from a Raman spectrum in a wavenumber band from 900 $cm^{-1}$ (Kayser) to 1800 $cm^{-1}$ (Kayser) obtained by exciting the protection layer with an argon ion laser beam having a wavelength of 514.5 nm is subjected to waveform separation by the Gaussian function to split a peak (D peak) appearing around 1350 $cm^{-1}$ (Kayser) and a peak (G peak) appearing around 1520 $cm^{-1}$ (Kayser), the ratio [Dw/Gw] between a half width [Dw] of the D peak and a half width [Gw] of the G peak exceeds 0 and is not greater than 2.7.

The magnetic disk including the protection layer having such a characteristic according to this invention is superior in durability (LUL durability) in the LUL system ("Load Unload system") even when the film thickness of the protection layer is, for example, 5 nm or less.

Therefore, the magnetic disk according to this invention is appropriately used as a small-diameter large-capacity hard disk using the LUL system.

Upon manufacturing the magnetic disk, quality control is carried out so that the aforementioned ratio [Dw/Gw] between the half width [Dw] of the D peak and the half width [Gw] of the G peak exceeds zero and is not greater than 2.7. Thus, the magnetic disk having predetermined LUL durability can be stably manufactured.

[Structure 2]

According to this invention, in the above-mentioned magnetic disk, the ratio [Dw/Gw] between the half width [Dw] of the D peak and the half width [Gw] of the G peak falls within a range between 2 and 2.7.

In this case, the LUL durability can be more excellent.

[Structure 3]

According to this invention, in the above-mentioned magnetic disk, the protection layer has a film thickness within a range between 1 nm and 5 nm.

[Structure 4]

According to this invention, in the above-mentioned magnetic disk, a lubricant layer is deposited on the protection layer. The lubricant layer contains a perfluoropolyether compound having a hydroxyl group as a terminal group.

[Structure 5]

According to this invention, in the above-mentioned magnetic disk, the magnetic disk is for use in a load unload system.

[Structure 6]

According to this invention, in a method of manufacturing the magnetic disk mentioned above, the protection layer is deposited under the environment at a temperature between room temperature and 250° C.

In the method of manufacturing the magnetic disk according to this invention, it is possible to manufacture the magnetic disk excellent in durability (LUL durability) in the LUL system ("Load Unload system").

Therefore, the method of manufacturing the magnetic disk according to this invention is suitable for manufacturing a small-diameter hard disk using the LUL system.

Further, in the method of manufacturing the magnetic disk, quality control is carried out so that the aforementioned ratio [Dw/Gw] between the half width [Dw] of the D peak and the half width [Gw] of the G peak exceeds zero and is not greater than 2.7 or falls within a range between 2 and 2.7. Thus, the magnetic disk having predetermined LUL durability can be stably manufactured.

[Structure 7]

According to this invention, in the above-mentioned method of manufacturing the magnetic disk, the protection layer is deposited while a bias voltage is applied to the nonmagnetic substrate.

[Structure 8]

According to this invention, there is provided a method of evaluating a magnetic disk having a magnetic layer formed on a nonmagnetic substrate and a protection layer formed on the magnetic layer, the method comprising excluding photoluminescence from a Raman spectrum in a wavenumber band from 900 $cm^{-1}$ to 1800 $cm^{-1}$ obtained by excitation with an argon ion laser beam having a wavelength of 514.5 nm; performing waveform separation by the Gaussian function to split a D peak appearing around 1350 $cm^{-1}$ and a G peak appearing around 1520 $cm^{-1}$; and evaluating film quality of the protection layer based upon a ratio Dw/Gw between a half width Dw of the D peak and a half width Gw of the G peak.

In the method of evaluating the magnetic disk according to this invention, the magnetic disk can be evaluated for the durability (LUL durability) in the LUL system ("Load Unload system").

Therefore, the method of evaluating the magnetic disk according to this invention is suitable to evaluate a small-diameter hard disk using the LUL system.

Further, in the method of evaluating the magnetic disk, judgment is made about whether or not the aforementioned ratio [Dw/Gw] between the half width [Dw] of the D peak and the half width [Gw] of the G peak exceeds zero and is not greater than 2.7 or falls within a range between 2 and 2.7. Thus, it is possible to evaluate whether or not the magnetic disk has predetermined LUL durability.

As mentioned above, in the magnetic disk, the film quality of the protection layer containing carbon as a major component is such that the shape of the Raman spectrum defined in this invention is obtained, namely, such that the aforementioned ratio [Dw/Gw] between the half width [Dw] of the D peak and the half width [Gw] of the G peak exceeds zero and is not greater than 2.7 or falls within a range between 2 and 2.7. Thus, it is possible to obtain the protection layer having an excellent wear resistance and to obtain the magnetic disk superior in durability and particularly suitable for the LUL system.

The D peak is generally a peak attributable to crystallinity of carbon and is an index of SP3 indicating a diamond bond. On the other hand, the G peak is typically a peak attributable to graphite and is an index of SP2 indicating a graphite bond.

Presumably, the phenomenon that the half width of the D peak is decreased is caused by a reason that a large amount of a SP3 component indicating the diamond bond exist in the protection layer and consequently the D peak itself is sharpened. In this event, the amount of a SP2 component in the protection layer is relatively decreased so that the G peak is broadened. As a result, the half width of the G peak is increased.

Accordingly, when the ratio [Dw/Gw] between the half widths of these peaks is obtained, [Dw/Gw] is decreased in case where a diamond structure is predominant and the amount of the SP3 component is increased. On the other hand, [Dw/Gw] is increased in case where a graphite structure is predominant and the amount of the SP2 component [Dw/Gw] is increased.

Thus, in case where the ratio [Dw/Gw] of the half widths is used as the index, no influence is given by photoluminescence in the Raman spectrum. It is therefore possible to directly evaluate SP3 and SP2.

With respect to the D peak as the index of the SP3 component indicating the diamond bond in the protection layer, it has been said that the magnitude of the peak intensity is related to the durability of the protection layer. However, the peak intensity in the Raman spectrum is decreased as the film thickness is reduced. Therefore, the ratio (D/G) of the peak intensities as a conventional index is increased in measurement error as the film thickness is reduced. Therefore, appropriate evaluation is impossible. Moreover, assuming that the film thickness of the protection layer is 5 nm or less, it is found out that the protection layer exhibiting a high D peak intensity is not always excellent in durability also because the peak intensity itself is reduced.

Further, in the conventional index, attention was focused only upon the peak intensity and an influence of variation (variance) could not be considered. The ratio [Dw/Gw] of the half widths given attention in this invention is an index particularly considering the variation of SP3 also. Specifically, it is found out that the protection layer high in durability can be obtained by decreasing the variation of the SP3-derived component in the protection layer.

The present inventors set a depositing condition as means for decreasing the variation of SP3 and found out that the ratio [Dw/Gw] of the half widths of those peaks is a most direct and effective index for monitoring the variation.

Thus, according to this invention, it is possible to more accurately evaluate the states of the diamond structure and the graphite structure in the protection layer than the ratio (B/A) of the peak intensities as the conventional index. It is therefore possible to perform evaluation having excellent correlation with wear resistance even when the film thickness of the protection layer is 5 nm or less.

In the magnetic disk according to this invention, the protection layer containing carbon as a major component is a protection layer made of amorphous carbon. The protection layer made of amorphous carbon (so-called "diamond-like carbon") has appropriate hardness and durability.

In the magnetic disk according to this invention, the film quality of the protection layer containing carbon as a major component can be obtained, for example, by the use of the following deposition method. By selecting CVD (Chemical Vapor Deposition), the protection layer having suitable film quality can be obtained. Further, it is preferable to deposit the protection layer while applying a bias.

In the conventional sputtering, carbon atoms are deposited onto the nonmagnetic substrate only by collision energy of Ar ions. In contrast, in CVD, deposition is carried out under a high-energy condition so that a dense film having high hardness can be deposited. Therefore, in the protection layer containing carbon as a major component, the amount of the diamond component is increased so that the ratio [Dw/Gw] of the half widths of those peaks is decreased.

In addition, the present inventors have found out that an electric power of a bias power supply is an important parameter for controlling the ratio [Dw/Gw] of the half widths of those peaks. It is desired that, as the bias power supply, a high-frequency power supply is used and that high frequency power of −100 W to −400 W, preferably, −100 W to −300 W is applied to the nonmagnetic substrate. The frequency of the bias power supply need not be particularly restricted but may be in a RF range, for example, approximately 27 MHz.

In this invention, specific limitation is not imposed upon CVD. It is however preferable to adopt plasma CVD (P-CVD) of exciting atoms by the use of plasma. The protection layer formed by plasma CVD is high in both denseness and hardness and is capable of suitably preventing metal ions of the magnetic layer from migrating onto the surface of the magnetic disk. Thus, this protection layer is particularly preferable as a thinned protection layer and is also excellent in LUL durability.

In case where the protection layer is formed by plasma CVD, it is desirable to form amorphous carbon (diamond-like carbon) by using a hydrocarbon gas as a reactive gas.

As the reactive gas in CVD, lower hydrocarbon is preferably used. In particular, it is preferable to use any one of lower saturated hydrocarbon, lower unsaturated hydrocarbon, and lower cyclic hydrocarbon. As lower saturated hydrocarbon, use may be made of methane, ethane, propane, butane, octane, or the like. As lower unsaturated hydrocarbon, use may be made of ethylene, propylene, butylene, acetylene, or the like. As lower cyclic hydrocarbon, use may be made of benzene, toluene, xylene, styrene, naphthalene, cyclohexane, or the like. The term "lower" referred to herein means hydrocarbon having 1 to 10 carbon atoms per one molecule.

Lower hydrocarbon is preferably used as the reactive gas because, as the number of carbon atoms per one molecule is increased, it becomes difficult to vaporize hydrocarbon as the gas for supply to a deposition apparatus and to decompose hydrocarbon upon plasma discharge. Further, if the number of carbon atoms per one molecule is increased, the formed protection layer tends to contain a large amount of a polymer hydrocarbon component so that denseness and hardness of the protection layer are undesirably decreased.

From the above-mentioned viewpoint, lower hydrocarbon is preferably used as hydrocarbon for use as the reactive gas In particular, use of acetylene is particularly preferable because a dense protection layer high in hardness can be formed.

Moreover, the protection layer formed by plasma CVD is preferably a protection layer made of amorphous carbon containing hydrogen (hydrogenated diamond-like carbon). The protection layer made of amorphous carbon containing hydrogen is particularly preferable in this invention because the denseness of the protection layer is further increased and the hardness is also increased.

In this event, the content of hydrogen is preferably not smaller than 3 at % and smaller than 20 at % with respect to carbon when measurement is carried out by HFS (hydrogen forward scattering). In the protection layer made of amorphous carbon containing hydrogen, in case where the content of hydrogen with respect to carbon is smaller than 3 at %, the denseness may be lowered and therefore, migration of metal ions may not be prevented. In this case, the hardness of the protection layer may be lowered and, therefore, the magnetic layer may not be suitably protected against impact force upon LUL starting. In the protection layer made of amorphous carbon containing hydrogen, in case where the content of hydrogen with respect to carbon is 20 at % or more, the amount of the polymeric carbon component is increased and, therefore, adhesion to the magnetic layer may be lowered. As a consequence, upon LUL starting, the protection layer may be undesirably peeled off from the magnetic layer.

It is also preferable that the protection layer formed by plasma CVD is made of amorphous carbon containing hydrogen and nitrogen (hydrogenated nitrogenated diamond-like carbon). The present inventors have found out that, in the protection layer made of amorphous carbon containing hydrogen and nitrogen, the content of nitrogen with respect to carbon is an important parameter for controlling the ratio [Dw/Gw] of the half widths of the peaks. In this case, the content of nitrogen with respect to carbon in the protection layer has relevancy to adhesion with a lubricant layer which will be described later.

Further, the present inventors have found out that a deposition temperature upon deposition of the protection layer is an important parameter for controlling the ratio [Dw/Gw] of the half widths of the peaks.

The deposition temperature upon depositing the protection layer is preferably 250° C. or lower. If the deposition temperature becomes excessively high, it is assumed that carbon atoms, which reach the nonmagnetic substrate, are easily movable on the nonmagnetic substrate and diffuse into a surface layer to exhibit graphite growth.

More preferably, the nonmagnetic substrate is forcedly cooled immediately before depositing the protection layer. In this event, the temperature of the nonmagnetic substrate is desirably 150° C. or lower. Typically, immediately after the nonmagnetic substrate is introduced into the deposition apparatus, the nonmagnetic substrate is sometimes heated to approximately 300° C. by the use of a heater. This enables the magnetic layer to maintain a desired coercive force as the magnetic disk. Therefore, although the temperature of the magnetic substrate is gradually lowered as an underlayer and the magnetic layer are successively deposited on the nonmagnetic substrate, the temperature may not sufficiently be lowered upon depositing the protection layer. In such case, it is desirable to cool the nonmagnetic substrate immediately before depositing the protection layer.

Specifically, a He (helium) gas high in specific heat and cooling efficiency is introduced into a chamber immediately before depositing the protection layer. Thus, it is possible to obtain a cooling effect and to lower the temperature of the nonmagnetic substrate. No particular restriction is imposed upon the lower limit of the deposition temperature of the protection layer. However, the room temperature (for example, about 20° C.) or higher is practically preferable.

In case where then protection layer is deposited by plasma CVD, a deposition rate upon deposition is adjusted to a predetermined rate so that the protection layer having desired film quality can be readily obtained. The deposition rate preferably falls within a range of about 0.2 [nm/second] to 1.8 [nm/second].

In this invention, the lubricant layer formed on the protection layer is preferably perfluoropolyether having a hydroxyl group as a terminal group. Perfluoropolyether has a straight-chain structure and exhibits a lubricating performance suitable as the lubricant layer of the magnetic disk. Further, the lubricant layer has the hydroxyl group (OH) as the terminal group so as to exhibit high adhesive performance with respect to the protection layer. In particular, in case where the protection layer contains nitrogen, nitrogen ions ($N^+$) and hydroxyl ions ($OH^-$) exhibit high affinity and, therefore, the lubricant layer advantageously has high adhesion with respect to the protection layer.

As a perfluoropolyether compound having the hydroxyl group as the terminal group, the number of hydroxyl groups contained in one molecule preferably falls within a range between 2 and 4. In case where the number of the hydroxyl groups contained in one molecule is less than 2, the adhesion of the lubricant layer with respect to the protection layer may be undesirably lowered. On the other hand, In case where the number of the hydroxyl groups contained in one molecule is greater than 4, the adhesion of the lubricant layer with respect to the protection layer is excessively increased, and as a result, lubricating performance may be lowered.

The film thickness of the lubricant layer is appropriately adjusted within a range between 0.5 nm and 1.5 nm. In case where the film thickness of the lubricant layer is smaller than 0.5 nm, the lubricating performance may be lowered. On the other hand, in case where the film thickness of the lubricant layer is greater than 1.5 nm, the adhesion of the lubricant layer with respect to the protection layer may be lowered.

In this invention, the film thickness of the protection layer preferably falls within a range between 1 nm and 5 nm. When the film thickness of the protection layer is smaller than 1 nm, migration of metal ions of the magnetic layer may not sufficiently be prevented. Further, there is a problem in LUL durability and wear resistance. The film thickness of the protection layer is preferably 5 nm or less so as not to prevent improvement of the spacing loss between the magnetic disk and the magnetic head. In case where the film thickness of the protection layer is 5 nm or less, this invention is particularly useful.

The magnetic disk according to this invention can be suitably used as the magnetic disk for a HDD (hard disk drive) of the LUL system.

In this invention, it is preferable to use a glass substrate as the nonmagnetic substrate. Since the glass substrate has a flat and smooth surface and high rigidity, a flying height of the magnetic head can be stably reduced so that the spacing loss between the magnetic disk and the magnetic head ca be improved. Thus, the glass substrate is particularly preferable in this invention.

As a material of the glass substrate, an aluminosilicate glass is particularly preferable. The aluminosilicate glass is given high rigidity by chemical strengthening In this invention, the surface of the magnetic disk preferably has surface roughness of 6 nm or less in Rmax and 0.6 nm or less in Ra. When Rmax exceeds 6 nm, the improvement in the spacing loss between the magnetic disk and the magnetic head may be undesirably prevented. It is noted here that the surface roughness is defined by Japanese Industrial Standard (JIS) B0601.

The magnetic disk according to this invention is excellent in durability (LUL durability) in the LUL system ("Load Unload system") even when the film thickness of the protection layer is, for example, 5 nm or less.

Therefore, the magnetic disk according to this invention is suitable for use as a small-diameter large-capacity hard disk using the LUL system.

Upon manufacturing the magnetic disk, quality control is carried out so that the aforementioned ratio [Dw/Gw] between the half width [Dw] of the D peak and the half width [Gw] of the G peak exceeds zero and is not greater than 2.7 or falls within a range between 2 and 2.7. Thus, the magnetic disk having predetermined LUL durability can be stably manufactured.

Further, in the method of manufacturing the magnetic disk according to this invention, it is possible to manufacture the magnetic disk excellent in durability (LUL durability) in the LUL system ("Load Unload system") even when the film thickness of the protection layer is, for example, 5 nm or less.

Therefore, the method of manufacturing the magnetic disk according to this invention is suitable for production of a small-diameter large-capacity hard disk using the LUL system.

Moreover, in the method of manufacturing the magnetic disk, quality control is carried out so that the aforementioned ratio [Dw/Gw] between the half width [Dw] of the D peak and the half width [Gw] of the G peak exceeds zero and is not greater than 2.7 or falls within a range between 2 and 2.7. Thus, it is possible to stably manufacture the magnetic disk having the predetermined LUL durability.

In addition, in the method of evaluating the magnetic disk according to this invention, the magnetic disk can be evaluated for the durability (LUL durability) in the LUL system ("Load Unload system").

Therefore, the method of evaluating the magnetic disk according to this invention is suitable for evaluation of a small-diameter hard disk using the LUL system.

In the method of evaluating the magnetic disk, judgment is made about whether or not the aforementioned ratio [Dw/Gw] between the half width [Dw] of the D peak and the half width [Gw] of the G peak exceeds zero and is not greater than 2.7 or falls within a range between 2 and 2.7. Thus, it is possible to evaluate whether or not the magnetic disk has predetermined LUL durability.

DESCRIPTION OF THE PREFERRED EMBODIMENT

Figure 1:
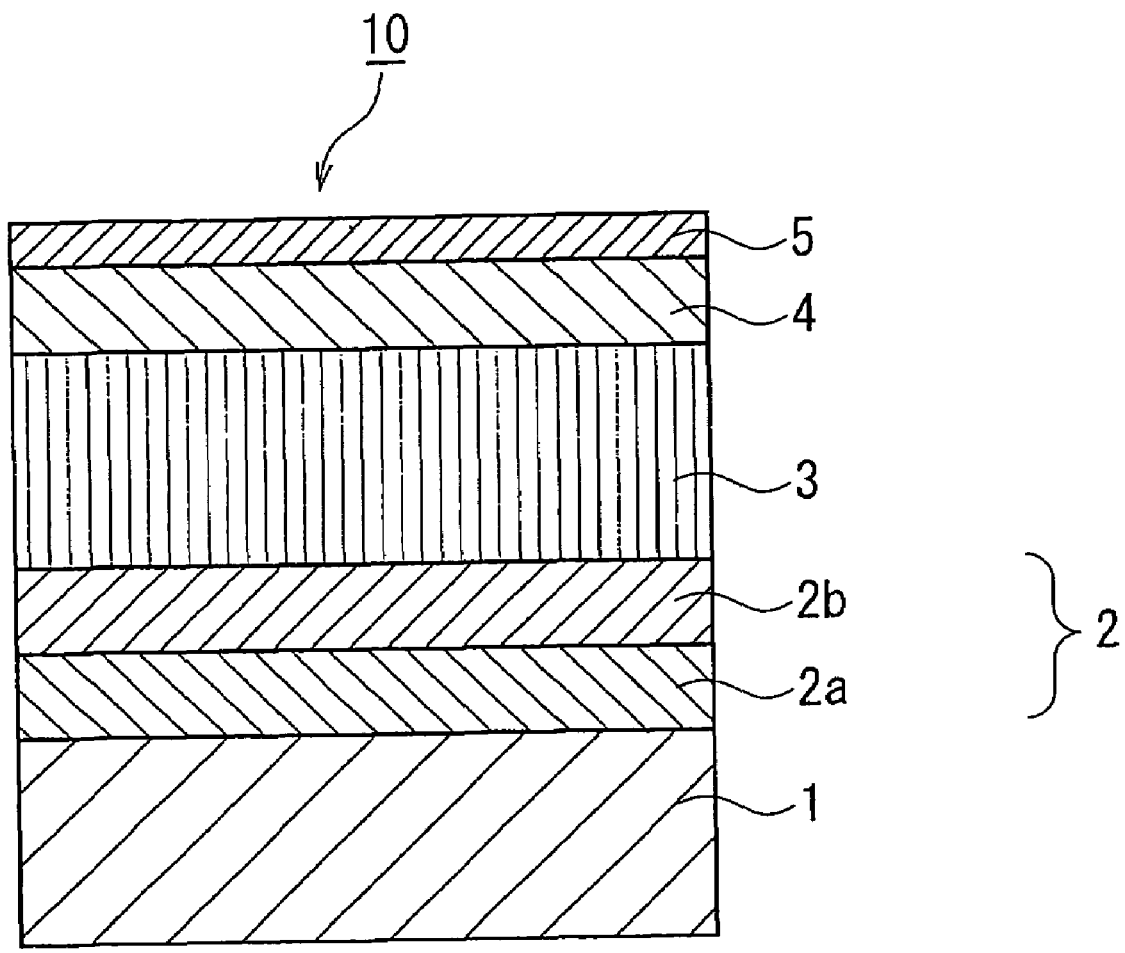
FIG. 1 is a sectional view showing a structure of a magnetic disk according to this invention.

FIG. 1 is a sectional view schematically showing a film structure of a magnetic disk according to an embodiment of this invention.

The magnetic disk 10 comprises at least a glass substrate 1 as a nonmagnetic substrate, a magnetic layer 3 formed on the glass substrate 1, a protection layer 4 formed on the magnetic layer 3, and a lubricant layer 5 formed on the protection layer 4.

Between the nonmagnetic substrate 1 and the magnetic layer 3, a nonmagnetic metal layer (nonmagnetic underlayer) 2 comprising a seed layer 2a and an underlayer 2b is formed. In this magnetic disk 10, all layers except the magnetic layer 3 are made of a nonmagnetic substance. In this embodiment, the magnetic layer 3 and the protection layer 4 are formed in contact with each other and the protection layer 4 and the lubricant layer 5 are formed in contact with each other.

Hereinafter, detailed description will be made of the magnetic disk 10 with reference to examples and comparative examples. It is noted here that this invention is not restricted to these examples.

EXAMPLE 1

Hereinafter, description will be made of the magnetic disk and a method of manufacturing the same in Example 1.

At first, an aluminosilicate glass was molded into a disk shape to obtain a glass disk. The glass disk was subjected to grinding, precision polishing, end-face polishing, precision cleaning, and chemical strengthening. As a consequence, a flat, smooth, and high-rigidity glass substrate 1 for a magnetic disk was produced.

This glass substrate 1 was a glass substrate for a "1.0 inch type" magnetic disk and had a diameter of 27.4 mm, an inner diameter of 7 mm, and a disk thickness of 0.381 mm.

By the use of an AFM (atomic force microscope), the surface roughness of the glass substrate 1 obtained as mentioned above was measured. As a result, it was confirmed that the glass substrate 1 had a flat and smooth surface having Rmax of 4.48 nm and Ra of 0.40 nm.

Next, by the use of a fixed-target deposition apparatus, the seed layer 2a, the underlayer 2b, and the magnetic layer 3 were successively deposited on the glass substrate 1 by DC magnetron sputtering. Specifically, at first, by the use of an Al—Ru (aluminum-ruthenium) alloy (Al: 50 at %, Ru: 50 at %) as a sputtering target, the seed layer 2a made of the Al—Ru alloy and having a thickness of 30 nm was deposited on the glass substrate 1 by sputtering.

Then, by the use of a Cr—Mo (chromium-molybdenum) alloy (Cr: 80 at %, Mo: 20 at %) as a sputtering target, the underlayer 2b made of the Cr—Mo alloy and having a thickness of 20 nm was deposited on the seed layer 2a by sputtering.

Subsequently, by the use of a Co—Cr—Pt—B (cobalt-chromium-platinum-boron) alloy (Cr: 20 at %, Pt: 12 at %, B: 5 at %, the balance Co) as a sputtering target, the magnetic layer 3 made of the Co—Cr—Pt—B alloy and having a thickness of 15 nm was deposited on the underlayer 2b by sputtering.

Before depositing the nonmagnetic metal layer 2, the nonmagnetic substrate 1 was heated by a heating system using a heater so that the temperature of the nonmagnetic substrate 1 would be 250° C. upon forming the protection layer 4 on the magnetic layer 3. Herein, the temperature of the nonmagnetic substrate 1 was confirmed by the use of a radiation thermometer via a window of a chamber immediately before forming the protection layer 4.

On the magnetic layer 3 thus formed, the protection layer 4 made of carbon, hydrogen, and nitrogen was formed by the use of plasma CVD (P-CVD). Specifically, by using a mixed gas obtained by mixing 97% acetylene and 3% nitrogen as the reactive gas, deposition was carried out by plasma CVD so that the protection layer 4 having a film thickness of 3.0 nm was formed on the magnetic layer 3.

In order to obtain the protection layer 4 having desired film quality, a deposition rate upon depositing the protection layer 4 was set to 1 [nm/second]. Upon depositing the protection layer 4, a high-frequency power having a frequency of 27 MHz was applied to an electrode to generate plasma. Moreover, a bias voltage of −300 W was applied.

For the film thickness of the protection layer 4, an actual film thickness was measured by a cross-sectional observation using a transmission electron microscope (TEM).

In the above-mentioned process, by applying a voltage to the plasma, plasma CVD deposition may be carried out as IBD (Ion Beam Deposition). In this case, it is possible to control the film quality of the protection layer 4 also by an ion beam extraction voltage.

After forming the protection layer 4, the protection layer 4 was excited by an argon laser beam having a wavelength of 514.5 nm to obtain a Raman spectrum in a wavenumber band from 900 cm$^{-1}$ (Kayser) to 1800 cm$^{-1}$. A spectrum obtained by excluding photoluminescence from the Raman spectrum were subjected to waveform separation using the Gaussian function to split a peak (D peak) appearing on a low wavenumber side (around 1350 cm$^{-1}$) and a peak (G peak) appearing on a high wavenumber side (around 1520 cm$^{-1}$). In this event, the ratio [Dw/Gw] between the half width [Dw] of the D peak and the half width [Gw] of the G peak was equal to 2.12.

The following Table 1 shows the above-mentioned measurement results and test results which will be described later as well as measurement results and test results for other examples and comparative examples which will be described later.

TABLE 1

| | film quality of protection layer | | | pin-on-disk test [number of times of sliding/nm] | fly stiction test | LUL durability test number of times |
|---|---|---|---|---|---|---|
| | Dw/Gw | B/A | D/G | | | |
| Example 1 | 2.12 | 1.43 | 0.62 | 250 | 95% | 1,000,000 times or more |
| Example 2 | 2.05 | 1.39 | 0.62 | 320 | 96% | 1,000,000 times or more |
| Example 3 | 2.32 | 1.40 | 0.62 | 120 | 92% | 1,000,000 times or more |
| Example 4 | 2.08 | 1.39 | 0.62 | 300 | 95% | 1,000,000 times or more |
| Example 5 | 2.10 | 1.43 | 0.61 | 500 | 96% | 1,000,000 times or more |
| Example 6 | 2.68 | 1.32 | 0.58 | 110 | 91% | 1,000,000 times or more |
| Example 7 | 1.99 | 1.42 | 0.60 | 400 | 75% | failed at 200,000 times |
| Comparative Example 1 | 2.71 | 1.41 | 0.61 | 40 | 89% | failed at 200,000 times |
| Comparative Example 2 | 2.73 | 1.42 | 0.62 | 30 | 87% | failed at 150,000 times |
| Comparative Example 3 | 2.20 | 1.40 | 0.60 | 1 | 10% | failed at 1,000,000 × 0.01 (100) times |

Figure 2:
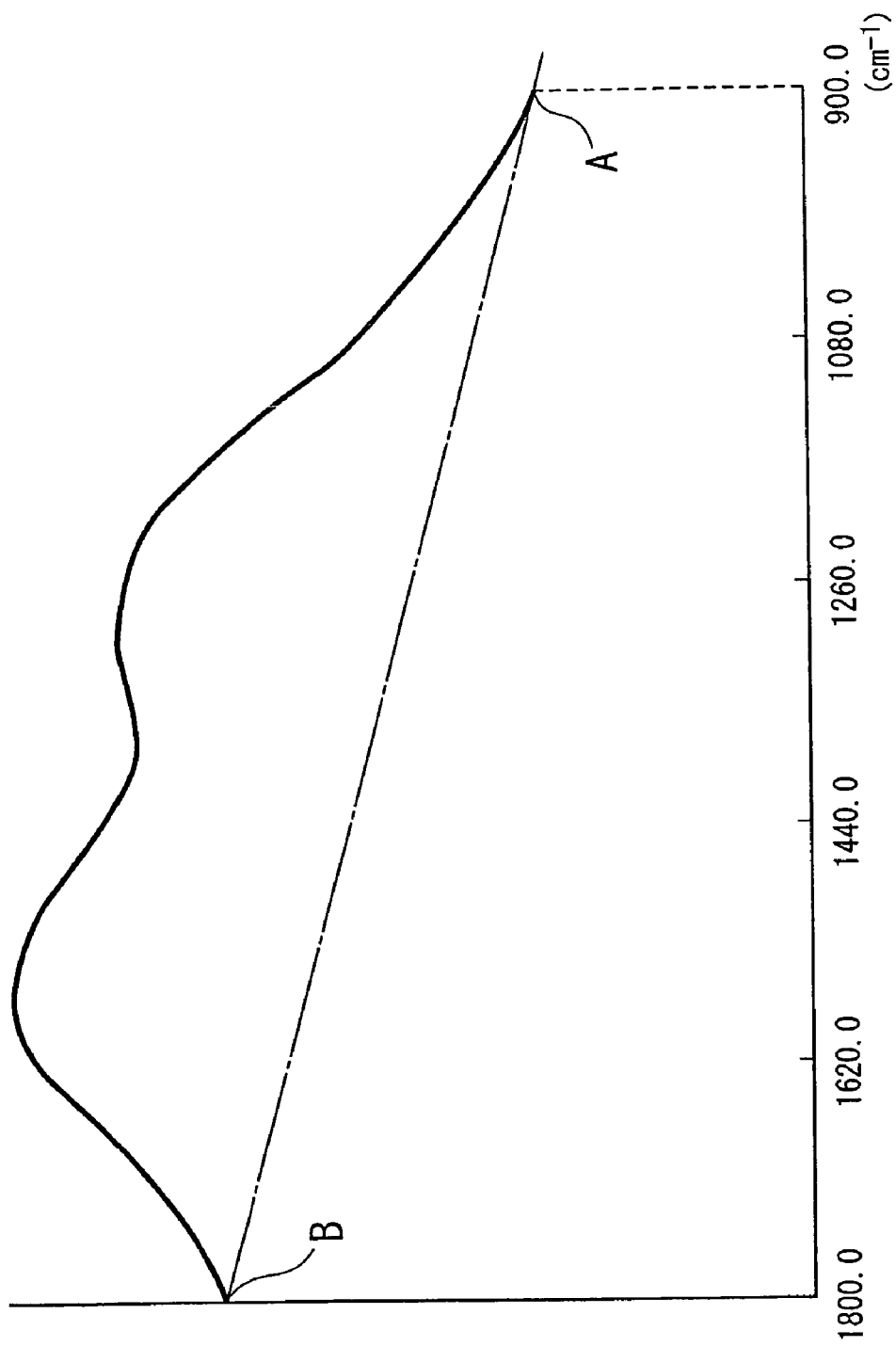
FIG. 2 is a graph schematically showing a Raman spectrum obtained from a protection layer of the magnetic disk according to this invention.

FIG. 2 is a graph schematically showing the Raman spectrum obtained in the embodiment of this invention.

Figure 3:
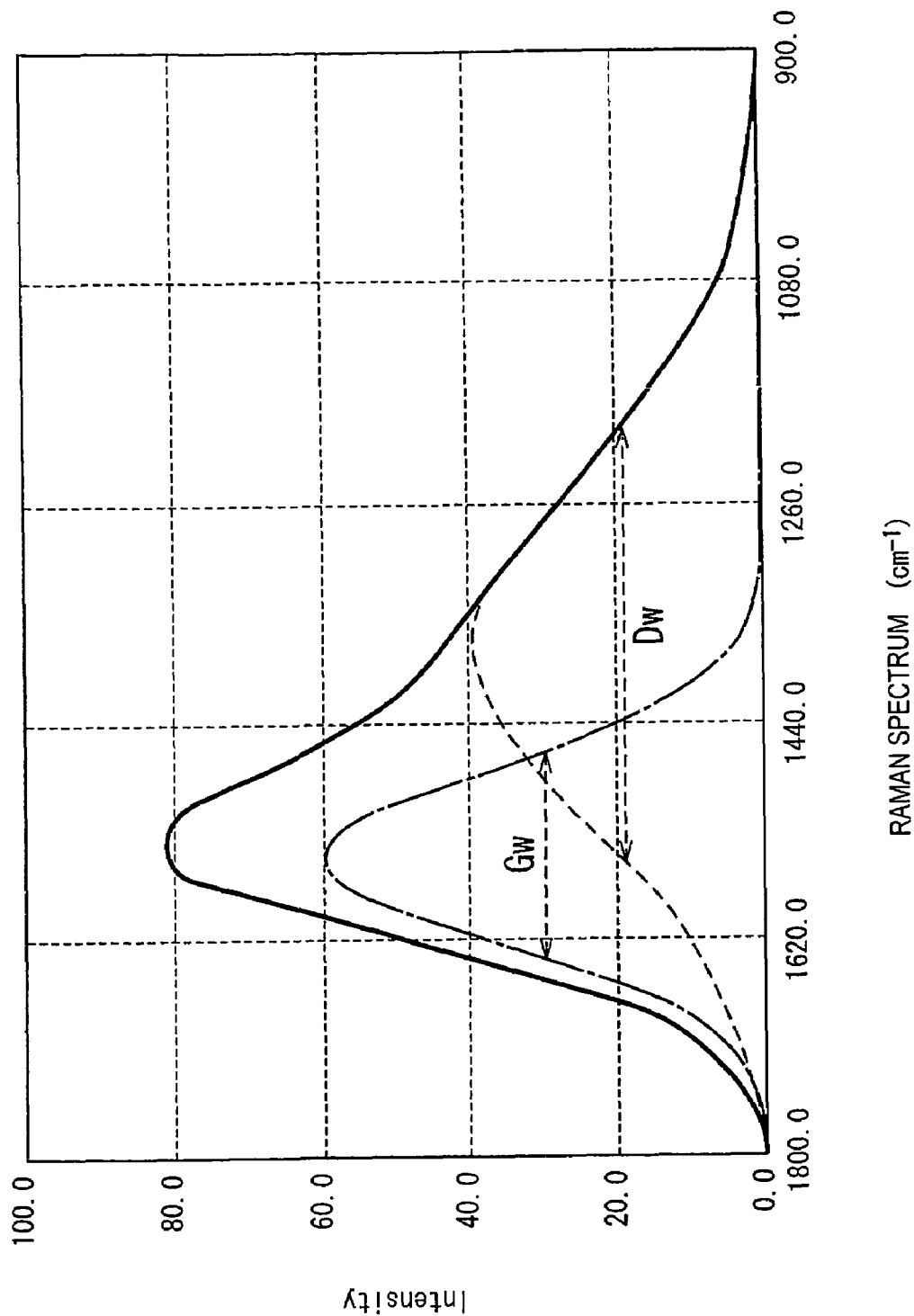
FIG. 3 is a graph schematically showing a Raman spectrum excluding photoluminescence, which is obtained from the protection layer of the magnetic disk according to this invention.
Figure 4:
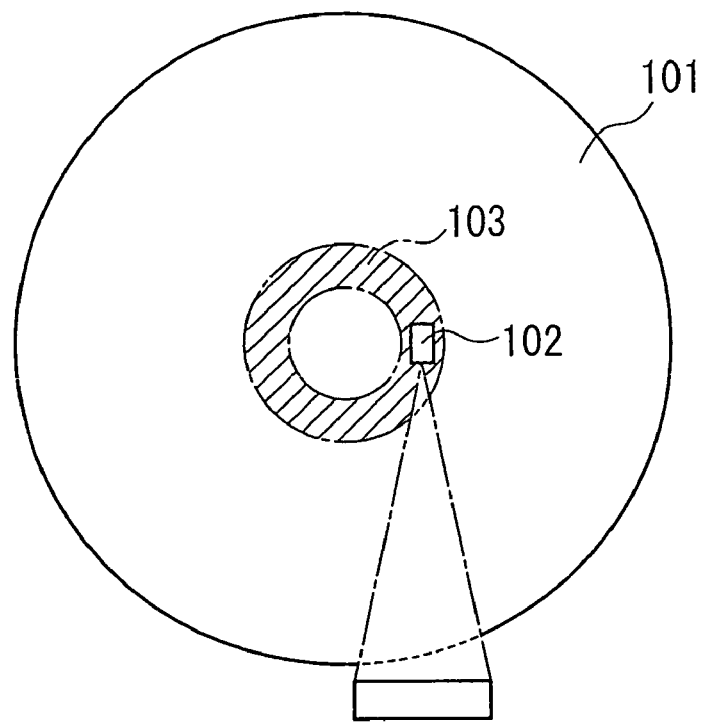
FIG. 4 is a plan view showing a positional relationship between a magnetic disk and a magnetic head in a CSS system.
Figure 5:
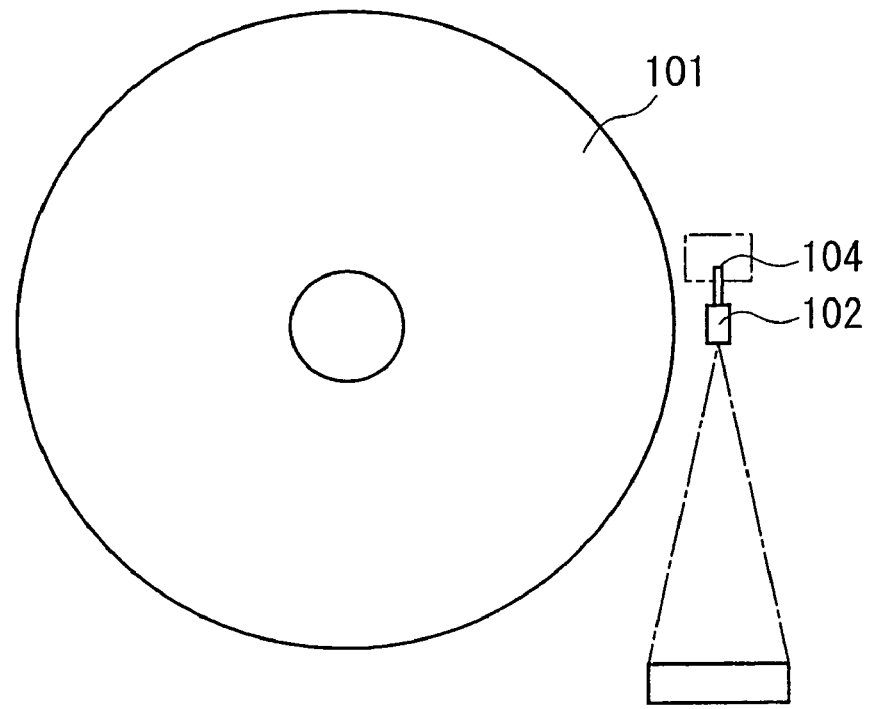
FIG. 5 is a plan view showing a positional relationship between a magnetic disk and a magnetic head in an LUL system.
Figure 6:
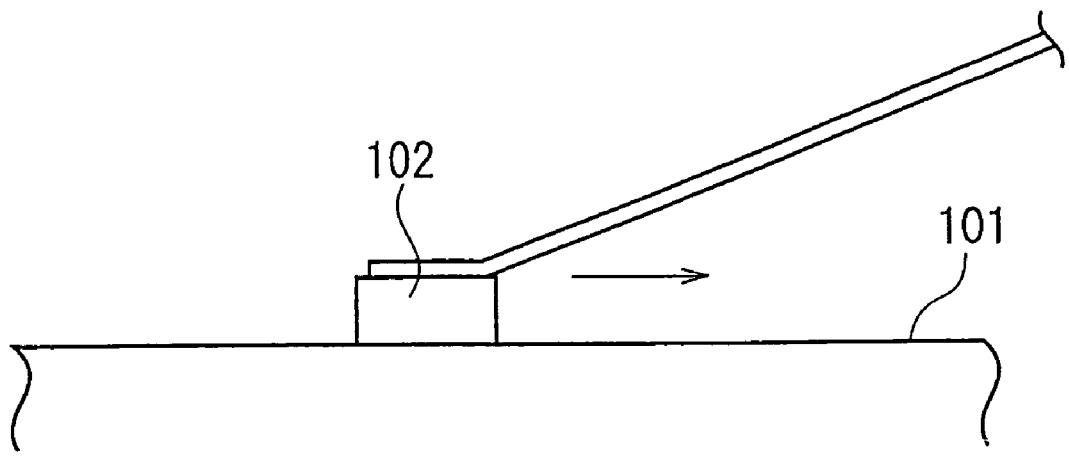
FIG. 6 is a side view for explaining durability of a protection layer in a CSS system.
Figure 7:
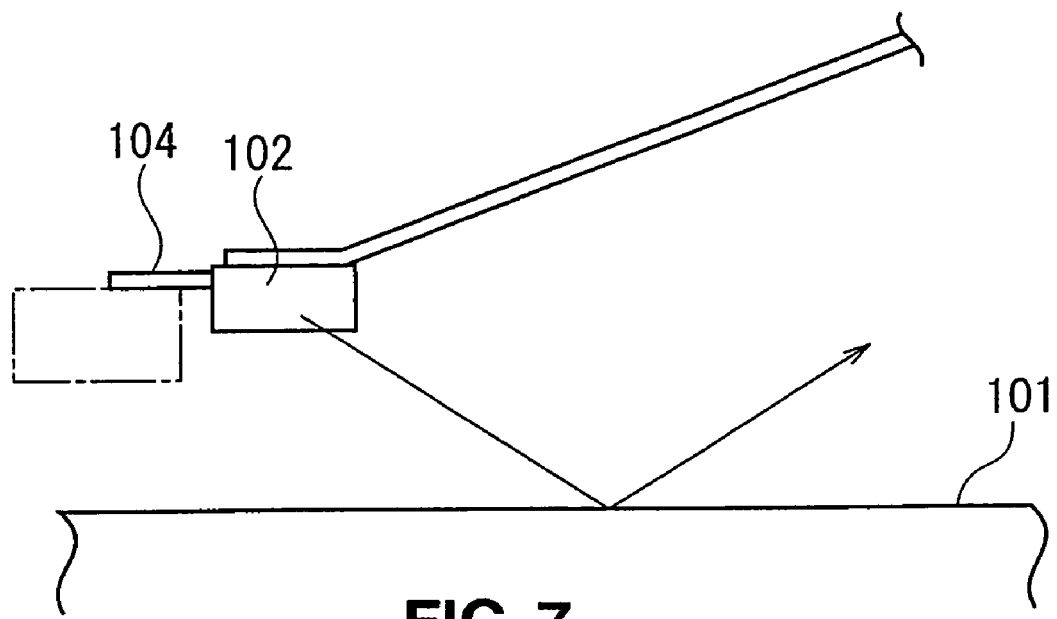
FIG. 7 is a side view for explaining durability of a protection layer in an LUL system.

FIG. 3 is a graph schematically showing the Raman spectrum excluding photoluminescence obtained in the embodiment of this invention.

The measurement in Raman spectroscopic analysis was carried out in the following manner. At first, an argon ion (Ar$^{2+}$) laser beam having a wavelength of 514.5 nm was irradiated onto the surface of the protection layer 4. As shown in FIG. 2, the Raman spectrum due to Raman scattering and appearing in a wavenumber band from 900 cm$^{-1}$ to 1800 cm$^{-1}$ was obtained. From this Raman spectrum, photoluminescence was removed. Specifically, in the Raman spectrum obtained as mentioned above, a point A at the wavenumber of 900 cm$^{-1}$ and a point B at the wavenumber of 1800 cm$^{-1}$ were connected by a straight line. A portion under the straight line was supposed as a background attributable to the photoluminescence and correction for removing the background was carried out as shown in FIG. 3. By using the Raman spectrum obtained by excluding the photoluminescence in the above-mentioned manner, the D peak and the G peak were split by waveform separation using the Gaussian function in accordance with the aforementioned definition. Then, the half widths [Dw] and [Gw] of the D peak and the G peak were obtained and the ratio [Dw/Gw] of the half widths was calculated.

The above-mentioned Raman spectroscopic analysis is typically carried out before forming the lubricant layer 5 by applying a lubricating agent on the protection layer 4 but may be performed after forming the lubricant layer 5. Before and after forming the lubricant layer 5, the Raman spectroscopic analysis was carried out. As a result, [Dw/Gw] values were completely equal to each other. Thus, it was found out that the existence of the lubricant layer 5 made of a perfluoropolyether based material having a hydroxyl group as a terminal group does not give any influence upon the Raman spectroscopic analysis.

Herein, as disclosed in the aforementioned patent document 1, B/A values and D/G values were also obtained.

On the protection layer 4 after cleaning, the lubrication layer 5 made of a perfluoropolyether (PFPE) compound was formed by dipping. Specifically, use was made of an alcohol-modified Fomblin® Z derivative manufactured by "Ausimont". This compound has one or two hydroxyl groups at each of opposite terminal ends of a perfluoropolyether main chain, i.e., two to four hydroxyl groups per a single molecule. The lubricant layer 5 had a thickness of 1 nm.

Thus, the magnetic disk 10 was manufactured. In the magnetic disk 10, the protection layer 4 was a layer made of amorphous carbon (hydrogenated nitrogenated diamond-like carbon) containing hydrogen and nitrogen.

The concentration (mixing ratio) of nitrogen contained in the protection layer 4 was measured by ESCA which will be described later and, as a result, was 0.08 in [nitrogen atom/carbon atom] concentration. Further, the concentration (mixing ratio) of hydrogen contained in the protection layer 4 was measured by HFS (hydrogen forward scattering) and, as a result, was 10 atomic %.

The surface roughness of the magnetic disk 10 was observed by the use of an AFM. As a consequence, it was confirmed that the magnetic disk 10 had a flat and smooth surface having Rmax of 4.61 nm and Ra of 0.41 nm. Moreover, a glide height was measured and, as a result, was 4.7 nm. In case where the flying height of the magnetic head is stably set to 12 nm or less, the glide height of the magnetic disk is desirably 6 nm or less. Therefore, this magnetic disk conforms to the above-mentioned criterion.

A variety of performances of this magnetic disk 10 were evaluated and analyzed in the following manner.

(1) Pin-on-disk Test

The pin-on-disk test was carried out in the following manner. Specifically, in order to evaluate the durability and the wear resistance of the protection layer 4, an $Al_2O_3$—TiC ball having a diameter of 2 mm was pressed against the protection layer 4 at a radial position of 22 mm of the magnetic disk 10 under the load of 15 g. Simultaneously, the magnetic disk 10 was rotated. Thus, the $Al_2O_3$—TiC ball and the protection layer 4 were relatively rotated and slid at the rate of 2 [m/sec]. Then, the number of times of sliding was measured until the protection layer 4 was broken due to the above-mentioned sliding.

The pin-on-disk test was passed if a value (i.e., [the number of times of sliding/nm]) obtained by normalizing the number of times of sliding before the protection layer 4 was broken with respect to the film thickness of the protection layer 4, is 100 times/nm or more. Generally, the magnetic head is not brought into contact with the magnetic disk 10 under an actual operating environment. Therefore, the pin-on-disk test is a durability test under a severe environment as compared with the actual operating environment.

For the magnetic disk 10 in this example, the result of the pin-on-disk test was 250 [number of times/nm] or more as shown Table 1.

(2) Fly Stiction Test

In the fly stiction test, 100 samples of the similar magnetic disks 10 were produced. By the use of a magnetic head having a flying height of 10 nm, a full-face glide test was carried out for the 100 magnetic disks.

Upon occurrence of fly stiction in the magnetic disk, a glide signal monitored by a piezo element sensor (or an AE sensor) mounted to the magnetic head suddenly diverges in all tracks of the magnetic disk. Therefore, occurrence of the fly stiction can be detected by observation using an oscilloscope. Upon occurrence of the fly stiction, the pass ratio of the glide test is dramatically decreased. Therefore, the tendency of occurrence of the fly stiction may be detected also by the pass ratio of the glide test.

As the pass ratio (yield) of the fly stiction test is higher, the production cost of the magnetic disk is lower. Thus, the pass ratio is desirably as high as possible but 90% or more is sufficient. If the pass ratio of the fly stiction test is 80%, the production cost is increased but within an allowable range.

In the magnetic disk 10 in this example, the pass ratio of the fly stiction test was 95% as shown in Table 1.

(3) LUL Durability Test

The LUL durability test was carried out in the following manner. The magnetic disk was mounted in the HDD (hard disk drive), was and rotated at 5400 rpm. The flying height of the magnetic head was set to 10 nm.

As a slider of the magnetic head, a NPAB (Negative Pressure Air Bearing) slider was used. As a reproducing element, a GMR element was used. The magnetic disk 10 was mounted in the HDD (hard disk drive). By the magnetic head, LUL operations were consecutively and repeatedly carried out. The number of times of the LUL operations without any failure caused in the HDD was measured. Evaluation was made using the number of times of the LUL operations as the LUL durability.

In the magnetic disk 10 of this example, the number of times of the LUL operations exceeded 1,000,000 without any failure as shown in Table 1.

Generally, in the LUL durability test, it is required that the number of times of the LUL operations exceeds consecutive 400,000 times without any failure. In a normal working environment of the HDD, It is said that the use for about 10 years is required until the number of times of LUL operations exceeds 400,000.

EXAMPLE 2

The example 2 is different from the magnetic disk 10 of the example 1 in that the temperature of the nonmagnetic substrate 1 upon forming the protection layer 4 was set to 200° C.

For the magnetic disk thus obtained, evaluation and analysis was carried out in the manner similar to the example 1. As a result, as shown in Table 1, all of the [Dw/Gw] value (2.05), the result of the pin-on-disk test (320 [times/nm]), and the result of the fly stiction test (96%) are within the respective criteria. In this example in which the deposition temperature of the protection layer 4 was lowered to 200° C., the result of the pin-on-disk test was 320 [times/nm] and the pass ratio of the fly stiction test was 96%. Thus, more desirable results were obtained than those of the example 1.

Further, the result of the LUL durability test was 1,000,000 times or more, thus causing no problem.

EXAMPLE 3

The example 3 is different from the magnetic disk 1 of the example 1 in that the applied bias upon forming the protection layer 4 was set to −100 W.

For the magnetic disk thus obtained, evaluation and analysis were carried out in the manner similar to the example 1. As a result, as shown in Table 1, all of the [Dw/Gw] value (2.32), the result of the pin-on-disk test (120 [times/nm)], and the result of the fly stiction test (92%) are within the respective criteria.

Further, the result of the LUL durability test was 1,000,000 times or more, thus causing no problem.

EXAMPLE 4

The example 4 is similar to the magnetic disk 1 of the example 1 except that the applied bias upon forming the protection layer 4 was set to −400 W.

For the magnetic disk thus obtained, evaluation and analysis were carried out in the manner similar to the example 1. As a result, as shown in Table 1, all of the [Dw/Gw] value (2.08), the result of the pin-on-disk test (300 [times/nm]), and the result of the fly stiction test (95%) are within the respective criteria. In this example in which the applied bias upon forming the protection layer 4 was set to −400 W, the result of the pin-on-disk test was 300 [times/nm]. Thus, more desirable result was obtained than that of the example 1.

Comparing the example 1, the example 3, and the example 4, It is understood that a higher applied bias upon forming the protection layer 4 leads to a better result of the pin-on disk test.

Further, the result of the LUL durability test was 1,000,000 times or more, thus causing no problem.

EXAMPLE 5

In the example 5, the applied bias upon forming the protection layer 4 was set to −300 W in the manner similar to the magnetic disk of the example 1. The film thickness of the protection layer 4 was set to 5 nm. This example is similar to the example 1 except that the film thickness of the protection layer 4 is different.

For the magnetic disk thus obtained, evaluation and analysis were carried out in the manner similar to the example 1. As a result, as shown in Table 1, all of the [Dw/Gw] value (2.10), the result of the pin-on-disk test (500 times/nm), and the result of the fly stiction test (96%) are within the respective criteria. In the example 5, the film thickness of the protection layer 4 is greater than that of the example 1. Therefore, the result of the pin-on-disk test was 500 [times/nm]. Thus, the durability and the reliability are high as compared with the example 1.

Further, the result of the LUL durability test was 1,000,000 times or more, thus causing no problem.

EXAMPLE 6

The example 6 is different from the magnetic disk of the example 1 in that the applied bias upon forming the carbon protection layer 4 was adjusted so that the [Dw/Gw] value was not greater than 2.7 and near to 2.7.

For the magnetic disk thus obtained, evaluation and analysis were carried out in the manner similar to the example 1. As a result, as shown in Table 1, the [Dw/Gw] value was 2.68. Both of the result of the pin-on-disk test (110 [times/nm]) and the result of the fly stiction test (91%) are within the respective criteria.

Further, the result of the LUL durability test was 1,000,000 times or more, thus causing no problem.

EXAMPLE 7

The example 7 is different from the magnetic disk of the example 1 in that the protection layer 4 was formed as a protection layer containing carbon and hydrogen. Specifically, the protection layer was formed by using only an acetylene gas as the reactive gas. Other conditions were similar to those in the example 1.

For the magnetic disk thus obtained, evaluation and analysis were carried out in the manner similar to the example 1. As a result, as shown in Table 1, the [Dw/Gw] value was 1.99 and the result of the pin-on-disk test (4000 [times/nm]) was excellent. However, the result of the fly stiction test was 75% and the result of the LUL durability test was failure at 200,000 times. These results are slightly inferior as compared with the other examples.

Specifically, as described in conjunction with the example 1, it is more desirable that the protection layer 4 contains carbon, hydrogen, and nitrogen. This is because nitrogen is desirably mixed in order to improve adhesion with the lubricating agent. If no nitrogen is mixed, fly stiction or the like frequently occurs because the adhesion with the lubricating agent is inferior.

Further, in case where the protection layer containing carbon and hydrogen is formed without mixing nitrogen, the [Dw/Gw] value is small and is less than 2. On the other hand, if the mixing ratio of nitrogen is large, the [Dw/Gw] value becomes large. In case where the mixing ratio of nitrogen is excessive, the [Dw/Gw] value exceeds 2.7.

A smaller [Dw/Gw] value provides a more excellent result of the pin-on-disk test. However, if the adhesion with the lubricating agent is week, fly stiction occurs and the result of the load unload test is defective. For this reason, it is more desirable that the [Dw/Gw] value falls with the range between 2 and 2.7, both inclusive, as the magnetic disk for the LUL system.

As seen from the above-mentioned examples and the comparative examples, the [Dw/Gw] value can be adjusted by the temperature of the nonmagnetic substrate 1, the applied bias value, and the nitrogen concentration of the reactive gas upon forming the protection layer 4. In order to obtain the [Dw/Gw] value exceeding 0 and not greater than 2.7, the temperature of the nonmagnetic substrate 1 is preferably not higher than 250° C. and the applied bias value desirably falls within the range between −100 W and −400 W. In order to obtain the [Dw/Gw] value within the range between 2 and 2.7, the concentration (mixing ratio) of nitrogen contained in the protection layer 4 preferably falls within the range between 0.05 and 0.2 in [nitrogen atom/carbon atom] measured by ESCA (electron spectroscopy for chemical analysis)

Herein, the nitrogen content of the protection layer 4 was measured by ESCA (electron spectroscopy for chemical analysis) at a radial position of 22 mm of the magnetic disk under the following conditions.

As the apparatus, "Quantum 200" manufactured by "Physical Electronics" was used. As an X ray exiting source, an Al—Kα ray (1486.6 ev) was used. An X ray source of 20 W was used. A vacuum degree of an analysis chamber was $2 \times 10^{-9}$ [Torr] or less. Pass energy was 117.5 eV and a photoelectron detection angle was 45° C. Peaks to be measured corresponded to carbon (C1s) and nitrogen (N1s). An analyzing region was 100 μmφ and the number of times of integration was 10 times. After measurement under the above-mentioned conditions, the ratio of nitrogen atoms and carbon atoms was calculated from respective atomic % calculated from peak intensities of C1s and N1s.

In case where measurement was carried out after applying the lubricating agent, the measurement was performed for carbon (C1s), nitrogen (N1s), and fluorine (F1s) as the peaks to be measured. In case where the measurement was carried out after applying the lubricating agent, the total amount of carbon and nitrogen except fluorine was assumed as 100% and the ratio between nitrogen atoms and carbon atoms was calculated. The measured ratio between nitrogen atoms and carbon atoms was not varied depending upon presence or absence of the lubricating agent.

COMPARATIVE EXAMPLE 1

Subsequently, the magnetic disk in the comparative example was manufactured.

The comparative example 1 is different from the magnetic disk of the example 1 in that the applied bias upon forming the carbon protection layer 4 was set to zero. Other conditions were similar to those in the example 1.

For the magnetic disk thus obtained, evaluation and analysis were carried out in the manner similar to the example 1. As a result, as shown in Table 1, the [Dw/Gw] value was 2.71. All of the result of the pin-on-disk test (40 [times/nm]), the result of the fly stiction test (89%), and the result of the LUL durability test (failed at 200,000 times) are beyond the respective criteria. Thus, the magnetic disk was rejected.

COMPARATIVE EXAMPLE 2

The comparative example 2 is different from the magnetic disk of the example 1 in that the temperature of the nonmagnetic substrate upon forming the protection layer 4 was 285° C. Other conditions were similar to those in the example 1.

For the magnetic disk thus obtained, evaluation and analysis were carried out in the manner similar to the example 1. As a result, as shown in Table 1, the [Dw/Gw] value was 2.73. All of the result of the pin-on-disk test (30 [times/nm]), the result of the fly stiction test (87%), and the result of the LUL durability test (failed at 150,000 times) are beyond the respective criteria. Thus, the magnetic disk was rejected.

COMPARATIVE EXAMPLE 3

In the comparative example 3, the protection layer 4 was formed by sputtering instead of plasma CVD.

For the magnetic disk thus obtained, evaluation and analysis were carried out in the manner similar to the example 1. As a result, as shown in Table 1, the [Dw/Gw] value was 2.20. However, the result of the pin-on-disk test (1 [times/nm} was completely defective. The result of the fly stiction test was 10% and the result of the LUL durability test was failure at $0.01 \times 1,000,000$ times (100 times). Thus, all results are beyond the respective criteria and the magnetic disk was rejected.

The film quality of the protection layer containing carbon as a major component and deposited by plasma CVD applicable for this invention has been described so far as the protection layer to which this invention is applicable. For example, with respect to a B/A value and a D/G value, this invention is also applicable to the protection layer having film quality such that the B/A value is 1.0 to 2.8 and a D/G value is 0.4 to 1.5.

Further, in this invention, the size of the magnetic disk is not particularly restricted. However, if this invention is applied particularly to a small-diameter magnetic disk, an excellent usefulness is exhibited. The "small diameter" referred to herein means a magnetic disk, for example, having a diameter of 65 mm or less, in particular, 50 mm or less. For example, the magnetic disk having a small diameter not greater than 30 mm is used in a car-mounted apparatus such as a so-called "car navigation system" or a memory device in a portable apparatus such as a so-called "PDA" and a mobile phone terminal apparatus. Therefore, high durability and high shock resistance are required as compared with a normal magnetic disk in an apparatus which is used in a fixed state. By applying this invention, these requirements are satisfied.

What is claimed is:

1. A magnetic disk having a magnetic layer formed on a nonmagnetic glass substrate and a protection layer formed on the magnetic layer, wherein:

the protection layer contains carbon as a major component and is deposited by plasma CYD;

the protection layer having a characteristic such that, when a spectrum is obtained by excluding photoluminescence from a Raman spectrum in a wavenumber band from 900 $cm^{-1}$ to 1800 $cm^{-1}$ obtained by exciting the protection layer with an argon ion laser beam having a wavelength of 514.5 nm and the spectrum is subjected to waveform separation by the Gaussian function to split a D peak appearing around 1350 $cm^{-1}$ and a G peak appearing around 1520 $cm^{-1}$, the ratio Dw/Gw between a half width Dw of the D peak and a half width Gw of the G peak falls within a range between 2 and 2.7, wherein the protection layer has a film thickness within a range between 1 nm and 5 nm, a lubricant layer containing a perfluoropolyether compound having a hydroxyl group as a terminal group is deposited on the protection layer, and the magnetic disk is for use in a load unload system.

* * * * *